United States Patent
Matsumaru et al.

(10) Patent No.: US 6,661,296 B2
(45) Date of Patent: Dec. 9, 2003

(54) PHASE LOCKED STATE DETECTING APPARATUS AND IMAGE PROCESSING APPARATUS

(76) Inventors: Makoto Matsumaru, c/o Pioneer Corporation, Tokorozawa Works. No. 2610 Hanazono 4-chome, Tokorozawa-shi, Saitama-ken (JP); Kunihiro Minoshima, c/o Pioneer Corporation, Tokorozawa Works. No. 2610 Hanazono 4-chome, Tokorozawa-shi, Saitama-ken (JP)

( * ) Notice: Subject to any disclaimer, the term of this patent is extended or adjusted under 35 U.S.C. 154(b) by 27 days.

(21) Appl. No.: 09/834,883

(22) Filed: Apr. 16, 2001

(65) Prior Publication Data

US 2001/0038676 A1 Nov. 8, 2001

(30) Foreign Application Priority Data

Apr. 14, 2000 (JP) ........................ P2000-113932

(51) Int. Cl.[7] .................................................. H03L 7/00
(52) U.S. Cl. ..................................... 331/25; 331/DIG. 2
(58) Field of Search ........................... 331/DIG. 2, 25; 375/376

(56) References Cited

U.S. PATENT DOCUMENTS

| | | | | |
|---|---|---|---|---|
| 5,008,635 A | * | 4/1991 | Hanke et al. ............... | 331/1 A |
| 5,656,977 A | * | 8/1997 | Kelkar et al. ............... | 331/25 |
| 5,680,076 A | * | 10/1997 | Kelkar et al. ............... | 331/25 |
| 5,870,002 A | * | 2/1999 | Ghaderi et al. ............. | 327/156 |
| 6,314,150 B1 | * | 11/2001 | Vowe ......................... | 327/150 |
| 6,320,469 B1 | * | 11/2001 | Friedberg et al. ........... | 327/156 |
| 6,353,358 B1 | * | 3/2002 | Yoshie ....................... | 329/304 |

* cited by examiner

Primary Examiner—Robert Pascal
Assistant Examiner—Joseph Chang
(74) Attorney, Agent, or Firm—Sughrue Mion, PLLC

(57) ABSTRACT

There is provided a phase locked state detecting apparatus for accurately detecting whether or not a phase locked state is canceled, the phase locked state detecting apparatus includes a comparator 17 for comparing a phase of a processing clock signal Smc generated by a phase locked loop for use in an information processing with a phase of a reference clock signal Src; an edge counter 18 for detecting a change of a frequency of the processing clock signal Smc; and a CPU 19 for judging based on a phase comparison result whether or not the processing clock signal Smc is in the phase locked state with respect to the reference clock signal Src, and subsequently judging based on a detection result of the frequency change whether or not the phase locked state is canceled.

23 Claims, 10 Drawing Sheets

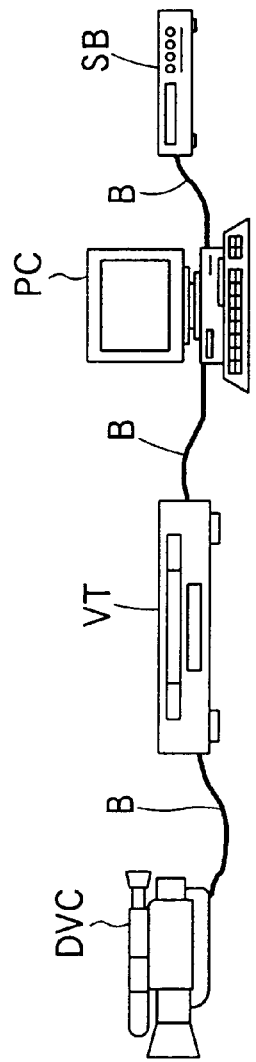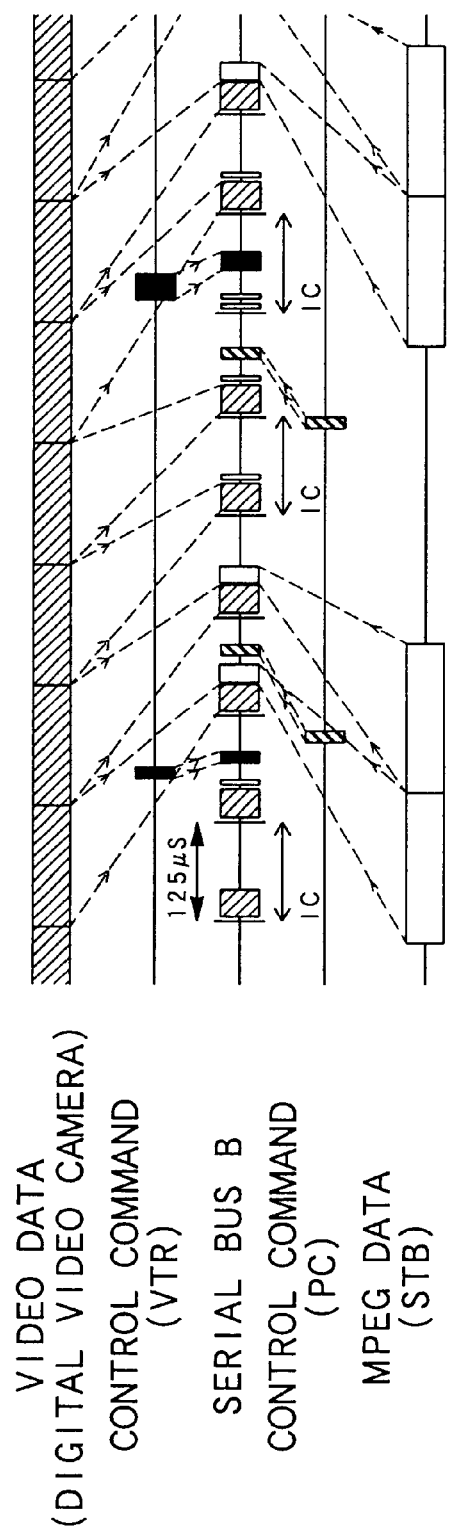

PHASE LOCKED STATE DETECTING APPARATUS AND IMAGE PROCESSING APPARATUS

BACKGROUND OF THE INVENTION

1. Field of the Invention

The present invention relates to a technical field of a phase locked state detecting apparatus and an information processing apparatus, particularly to a technical field of a phase locked state detecting apparatus for detecting a phase locked state of a signal which is phase controlled by a phase locked loop (PLL) circuit, and an information processing apparatus including the phase locked state detecting apparatus.

2. Description of Related Art

In recent years, an audio system has generally spread in which an information reproduction apparatus for reproducing music information from a compact disc (CD) is directly connected to an amplifier for amplifying and outputting the reproduced music information via a serial bus or another bus, and the reproduced music information is outputted to the outside via the amplifier.

In the amplifier in the audio system constituted as described above, a reference clock signal is generated based on time information transmitted with the reproduced music information. Then, a processing clock signal for use in a reproduction processing in the amplifier is set to a phase locked state based on the reference clock signal. The phase locked state means a state in which a phase of the reference clock signal accurately agrees with a phase of the processing clock signal. The processing clock signal maintaining this state is used to perform a necessary reproduction processing.

Moreover, this constitution accurately matches properties in data transmission of the information reproduction apparatus to those of the amplifier. For example, it matches properties of time information of the information reproduction apparatus to those of the amplifier. Therefore, while the information reproduction apparatus transmits the reproduced music information to the amplifier, it can amplify and output the reproduced music information.

In the conventional bus, however, depending on a bus type, when the information processing apparatus is newly connected to the bus, or when the connected information processing apparatus is disconnected from the bus, there may be cases where an initialization processing of temporarily initializing the information processing apparatus connected to the bus, and subsequently setting a new connection. For example, the initialization processing sets an information processing apparatus number for information transmission in the bus, or sets one information processing apparatus to generally control the information processing apparatuses interconnected via the bus with respect to the information transmission using the bus.

In this case, depending upon the bus type, the initialization processing includes an initialization processing requiring a long time for updating all connections in the information processing apparatuses connected to the bus (hereinafter referred to as long bus reset). The initialization processing also includes a short time initialization processing for performing the initialization processing similar to that of the long bus reset (hereinafter referred to as short bus reset).

On the other hand, the initialization processing is performed for the new connection of the information processing apparatus, even if the reproduction processing is executed in the amplifier. In this case, there is a problem that the music information being subjected to the reproduction processing is temporarily interrupted.

SUMMARY OF THE INVENTION

The present invention has been developed to solve the aforementioned problem, and an object thereof is to provide a phase locked state detecting apparatus for accurately detecting whether or not a phase locked state is canceled in an information processing apparatus connected to a bus and for minimizing interruption of an information processing when the aforementioned initialization processing is started during execution of the information processing in the information processing apparatus, and an information processing apparatus including the phase locked state detecting apparatus.

The above object of the present invention can be achieved by a phase locked state detecting apparatus in accordance with the present invention. The phase locked state detecting apparatus detects a phase locked state of a processing clock signal generated by a phase locked loop and used in an information processing. The phase locked state detecting apparatus includes: a comparing device for comparing a phase of a reference clock signal as the reference for controlling a phase of the processing clock signal by the phase locked loop with a phase of the processing clock signal and generating a comparison signal; a detecting device for detecting a change of frequency of the processing clock signal and generating a detecting signal; a first determining device for determining on the basis of the comparison signal whether or not the processing clock signal is in the phase locked state with respect to the reference clock signal, based on; and a second determining device for determining on the basis of the detecting signal whether or not the phase locked state is canceled after the first determining device determines that the processing clock signal is in the phase locked state.

According to the phase locked state detecting apparatus of the present invention, a result of phase comparison of the reference clock signal with the phase of the processing clock signal is used to determine whether or not the processing clock signal is in the phase locked state, and it is subsequently determined in accordance with a change of frequency of the processing clock signal whether or not the phase locked state is canceled. Therefore, in accordance with the change of the frequency (i.e., a frequency which does not follow even a change of the reference clock signal for a remarkably short time and does not quickly fluctuate) of the processing clock signal generated by a phased lock loop, it is determined whether or not the phase locked state is canceled. Therefore, even when there is a change of the reference clock signal for the remarkably short time, it is not determined that the phase locked state is canceled. The processing in which the processing clock signal in the phase locked state is used can be continued.

Moreover, the result of the phase comparison is used to determined whether or not the processing clock signal is in the phase locked state, and subsequently it is determined based on the change of the frequency of the processing clock signal itself whether or not the phase locked state of the processing clock signal is canceled. Therefore, it can accurately be detected whether or not the processing clock signal is in the phase locked state.

In one aspect of the phase locked state detecting apparatus of the present invention, the first determining device determines on the basis of the comparison signal that the processing clock signal is in the phase locked state with respect to the reference clock signal when a difference between the phase of the reference clock signal and the phase of the processing clock signal continues to be not more than a preset value for a preset period, and determines that the processing clock signal is not in the phase locked state with respect to the reference clock signal when a state of the difference being not more than the value does not continue for the period.

According to this aspect, it can securely be determined whether or not the processing clock signal is in the phase locked state.

In another aspect of the phase locked state detecting apparatus of the present invention, the second determining device determines on the basis of the detecting signal that the processing clock signal is in the phase locked state with respect to the reference clock signal when the change of the frequency of the processing clock signal is less than a preset threshold value, and determines that the processing clock signal is not in the phase locked state with respect to the reference clock signal when the change is not less than the threshold value.

According to this aspect, only the processing clock signal can be used to securely determine whether or not the processing clock signal is in the phase locked state.

The above object of the present invention can be achieved by an information processing apparatus in accordance with the present invention. The information processing apparatus includes the phase locked state detecting apparatus for detecting a phase locked state of a processing clock signal generated by a phase locked loop and used in an information processing. The phase locked state detecting apparatus is provided with: a comparing device for comparing a phase of a reference clock signal as the reference for controlling a phase of the processing clock signal by the phase locked loop with a phase of the processing clock signal and generating a comparison signal; a detecting device for detecting a change of frequency of the processing clock signal and generating a detecting signal; a first determining device for determining on the basis of the comparison signal whether or not the processing clock signal is in the phase locked state with respect to the reference clock signal, based on; and a second determining device for determining on the basis of the detecting signal whether or not the phase locked state is canceled after the first determining device determines that the processing clock signal is in the phase locked state. The information processing apparatus is provided with: a phase comparing device for detecting a phase difference between the reference clock signal and the processing clock signal and outputting a phase difference signal, being included in the phase locked loop; a filter device for subjecting the outputted phase difference signal to a predetermined filter processing and outputting a filter signal, being included in the phase locked loop; a generating device for generating an oscillation clock signal based on the outputted filter signal, being included in the phase locked loop; a frequency division device for dividing a frequency of the generated oscillation clock signal, generating the processing clock signal and outputting the processing clock signal to the phase locked state detecting apparatus and the phase comparing device, being included in the phase locked loop; and a processing device using the processing clock signal in the phase locked state with respect to the reference clock signal to perform an information processing based on a result of the determination in the phase locked state detecting apparatus.

Therefore, the processing clock signal which is in the phase locked state can be used to accurately perform the necessary information processing.

Moreover, even when the reference clock signal changes only for the remarkably short time, the information processing using the processing clock signal in the phase locked state can be continued.

In one aspect of the information processing apparatus of the present invention, the information processing is a reproduction processing of audio information inputted from the outside.

According to this aspect, the processing clock signal which is in the phase locked state can be used to accurately perform a necessary audio information reproduction processing.

Moreover, even when the reference clock signal changes only for the remarkably short time, the reproduction processing using the processing clock signal in the phase locked state can be continued.

In another aspect of the information processing apparatus of the present invention, the first determining device determines on the basis of the comparison signal that the processing clock signal is in the phase locked state with respect to the reference clock signal when a difference between the phase of the reference clock signal and the phase of the processing clock signal continues to be not more than a preset value for a preset period, and determines that the processing clock signal is not in the phase locked state with respect to the reference clock signal when a state of the difference being not more than the value does not continue for the period.

According to this aspect, According to this aspect, it can securely be determined whether or not the processing clock signal is in the phase locked state.

In another aspect of the information processing apparatus of the present invention, the second determining device determines on the basis of the detecting signal that the processing clock signal is in the phase locked state with respect to the reference clock signal when the change of the frequency of the processing clock signal is less than a preset threshold value, and determines that the processing clock signal is not in the phase locked state with respect to the reference clock signal when the change is not less than the threshold value.

According to this aspect, According to this aspect, only the processing clock signal can be used to securely determine whether or not the processing clock signal is in the phase locked state.

The above object of the present invention can be achieved by a phase locked state detecting method, in accordance with the present invention, for detecting a phase locked state of a processing clock signal generated by a phase locked loop and used in an information processing. The phase locked state detecting method includes: a comparing process of comparing a phase of a reference clock signal as the reference for controlling a phase of the processing clock signal by the phase locked loop with a phase of the processing clock signal and generating a comparison signal; a detecting process of detecting a change of frequency of the processing clock signal and generating a detecting signal; a first determining process of determining on the basis of the comparison signal whether or not the processing clock signal is in the phase locked state with respect to the reference clock signal, based on; and a second determining process of determining on the basis of the detecting signal whether or not the phase locked state is canceled after the first determining device determines that the processing clock signal is in the phase locked state.

According to the phase locked state detecting method of the present invention, a result of phase comparison of the reference clock signal with the phase of the processing clock signal is used to determine whether or not the processing clock signal is in the phase locked state, and it is subsequently determined in accordance with a change of frequency of the processing clock signal whether or not the phase locked state is canceled. Therefore, in accordance with the change of the frequency (i.e., a frequency which does not follow even a change of the reference clock signal for a remarkably short time and does not quickly fluctuate) of the processing clock signal generated by a phased lock loop, it is determined whether or not the phase locked state is canceled. Therefore, even when there is a change of the reference clock signal for the remarkably short time, it is not determined that the phase locked state is canceled. The processing in which the processing clock signal in the phase locked state is used can be continued.

Moreover, the result of the phase comparison is used to determined whether or not the processing clock signal is in the phase locked state, and subsequently it is determined based on the change of the frequency of the processing clock signal itself whether or not the phase locked state of the processing clock signal is canceled. Therefore, it can accurately be detected whether or not the processing clock signal is in the phase locked state.

In one aspect of the phase locked state detecting method of the present invention, the first determining process determines on the basis of the comparison signal that the processing clock signal is in the phase locked state with respect to the reference clock signal when a difference between the phase of the reference clock signal and the phase of the processing clock signal continues to be not more than a preset value for a preset period, and determines that the processing clock signal is not in the phase locked state with respect to the reference clock signal when a state of the difference being not more than the value does not continue for the period.

According to this aspect, it can securely be determined whether or not the processing clock signal is in the phase locked state.

In another aspect of the phase locked state detecting method of the present invention, the second determining process determines on the basis of the detecting signal that the processing clock signal is in the phase locked state with respect to the reference clock signal when the change of the frequency of the processing clock signal is less than a preset threshold value, and determines that the processing clock signal is not in the phase locked state with respect to the reference clock signal when the change is not less than the threshold value.

According to this aspect, only the processing clock signal can be used to securely determine whether or not the processing clock signal is in the phase locked state.

The above object of the present invention can be achieved by an information processing method, in accordance with the present invention, including the phase locked state detecting method for detecting a phase locked state of a processing clock signal generated by a phase locked loop and used in an information processing. The phase locked state detecting method includes: a comparing process for comparing a phase of a reference clock signal as the reference for controlling a phase of the processing clock signal by the phase locked loop with a phase of the processing clock signal and generating a comparison signal; a detecting process for detecting a change of frequency of the processing clock signal and generating a detecting signal; a first determining process for determining on the basis of the comparison signal whether or not the processing clock signal is in the phase locked state with respect to the reference clock signal, based on; and a second determining process for determining on the basis of the detecting signal whether or not the phase locked state is canceled after the first determining process determines that the processing clock signal is in the phase locked state. The information processing method includes: a phase comparing process for detecting a phase difference between the reference clock signal and the processing clock signal and outputting a phase difference signal in the phase locked loop; a filter process for subjecting the outputted phase difference signal to a predetermined filter processing and outputting a filter signal in the phase locked loop; a generating process for generating an oscillation clock signal based on the outputted filter signal in the phase locked loop; a frequency division process for dividing a frequency of the generated oscillation clock signal, generating the processing clock signal and outputting the processing clock signal so as to be used for the phase locked state detecting process and the phase comparing process in the phase locked loop; and a processing process using the processing clock signal in the phase locked state with respect to the reference clock signal to perform an information processing based on a result of the determination of the first determining process or the second determining process.

Therefore, the processing clock signal which is in the phase locked state can be used to accurately perform the necessary information processing.

Moreover, even when the reference clock signal changes only for the remarkably short time, the information processing using the processing clock signal in the phase locked state can be continued.

In one aspect of the information processing method of the present invention, the information processing is a reproduction processing of audio information inputted from the outside.

According to this aspect, the processing clock signal which is in the phase locked state can be used to accurately perform a necessary audio information reproduction processing.

Moreover, even when the reference clock signal changes only for the remarkably short time, the reproduction processing using the processing clock signal in the phase locked state can be continued.

In another aspect of the information processing method of the present invention, the first determining device determines on the basis of the comparison signal that the processing clock signal is in the phase locked state with respect to the reference clock signal when a difference between the phase of the reference clock signal and the phase of the processing clock signal continues to be not more than a preset value for a preset period, and determines that the processing clock signal is not in the phase locked state with respect to the reference clock signal when a state of the difference being not more than the value does not continue for the period.

According to this aspect, According to this aspect, it can securely be determined whether or not the processing clock signal is in the phase locked state.

In another aspect of the information processing method of the present invention, the second determining process determines on the basis of the detecting signal that the processing clock signal is in the phase locked state with respect to the reference clock signal when the change of the frequency of the processing clock signal is less than a preset threshold value, and determines that the processing clock signal is not in the phase locked state with respect to the reference clock signal when the change is not less than the threshold value.

According to this aspect, According to this aspect, only the processing clock signal can be used to securely determine whether or not the processing clock signal is in the phase locked state.

BRIEF DESCRIPTION OF THE DRAWINGS

FIG. 2A is a diagram showing another example of electric apparatuses serially connected via a serial bus according to IEEE 1394 standard;

FIG. 2B is a diagram showing a transmission manner on the serial bus;

DESCRIPTION OF THE PREFERRED EMBODIMENTS

Figure 1A:
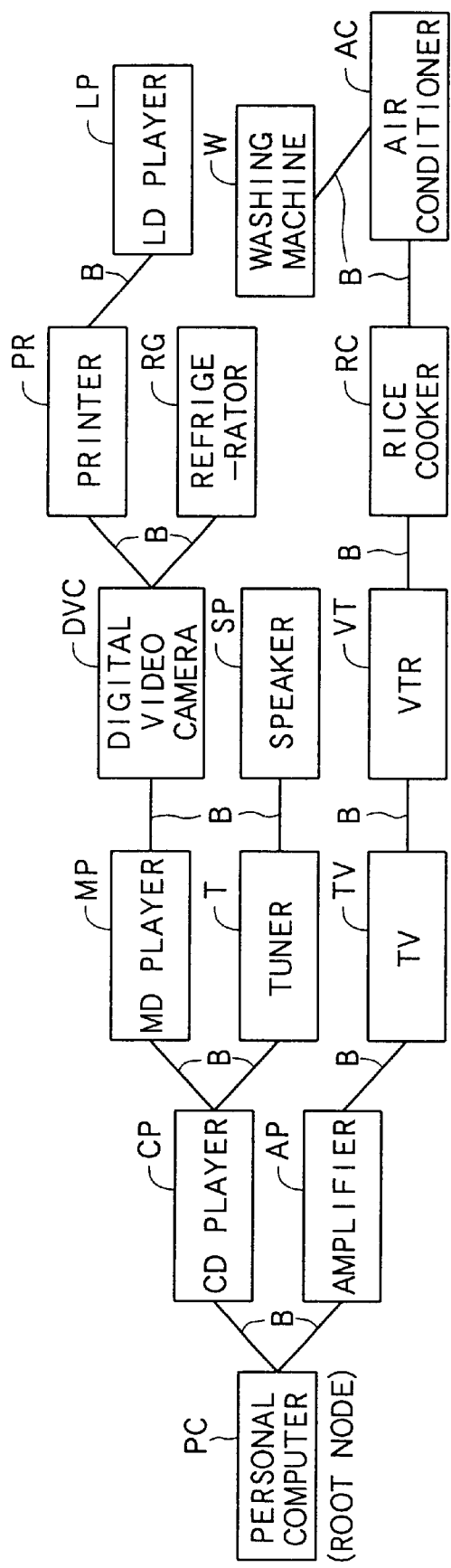
FIG. 1A is a diagram showing an example of electric apparatuses (nodes) serially connected according to IEEE 1394 standard.

A preferred embodiment of the present invention will be described with reference to the drawings.

Additionally, the embodiment described below conforms to IEEE 1394 standard, formally called "Institute of Electrical and Electronic Engineers (IEEE) Std. 1394 to 1995, IEEE Standard for a High Performance Serial Bus", which has recently been established as a new standard for mutually transmitting information among various electric products including a plurality of information apparatuses, e.g., a personal computer, a digital video camera, an mini disk (MD) player, and the like via a serial bus in real time. In the embodiment, there is provided a music information reproduction system constituted by connecting an information reproduction apparatus (hereinafter referred to as a player) for reproducing music information from information recording media such as DVD to an amplifier for amplifying the reproduced music information and outputting the information to the outside. In the embodiment, the present invention is applied to the system in which it is detected whether or not a processing clock signal used as the reference of processing such as amplification processing in the amplifier is in a phase locked state.

(I) Summary of IEEE 1394 Standard

Before description of the embodiment, information transmission by the serial bus based on the IEEE 1394 standard (hereinafter referred to simply as a serial bus standard) according to the present invention will generally be described.

In the serial bus standard, it is standardized that the plurality of information apparatuses (hereinafter referred to simply as nodes) are connected to one another via the serial bus, and information transmission for a plurality of channels are performed among the respective nodes in a time division manner. In the serial bus standard, it is standardized that the information can be transmitted using 63 different channels at maximum in the system connected via the serial bus.

In the serial bus standard, when another information apparatus is newly connected to a group of information apparatuses already connected to one another via the serial bus (i.e., during bus connection), or when the information apparatus is disconnected from the group of information apparatuses (i.e., during bus release), execution of initialization of the serial bus, so-called bus reset is standardized. Required time for the bus reset is set to 167 μsec in the serial bus standard. Moreover, with the bus reset, the following processing is executed, and a new connection form (hereinafter referred to as a topology) is constructed.

(1) With occurrence of the bus reset, the node having detected the occurrence of the bus reset sends a bus reset signal indicating the occurrence of the bus reset to all nodes connected to one another via the serial bus including. The node is the one to which the information apparatus is newly connected or the one which is disconnected.

(2) Subsequently, after the bus reset, tree identification is performed in order to connect the respective nodes on a tree. Moreover, the node positioned on the top of the connected tree is recognized as a root node.

(3) Subsequently, the recognized root node allows the respective nodes to recognize identification numbers (ID numbers) inherent to the respective nodes so that the respective nodes are identified in a tree system.

(4) Subsequently, connection states of all the nodes in the formed tree are managed, and an isochronous resource manager (IRM) node is set as a node displayed such that the node can be identified by the other nodes. Concretely, channels for use in the respective nodes, and transmission occupying time described later are managed as connection states.

(5) Finally, a bus manager node is set as a node for controlling information transmission states of all the nodes.

A new topology after the bus reset is constructed through the aforementioned five stages of processing.

Moreover, to actually transmit the information after the construction of the topology, a transmission node which is starting the information transmission inquires of the IRM node about the present communication state in the other nodes. If the channel and transmission occupying time the transmission node desires to use are available, the transmission node acquires the right to transmit the information and starts the information transmission.

Additionally, in the mutually connected serial bus, during the information transmission, if the bus reset is occurred due to the bus release or the bus connection, it is standardized that after the bus reset, each node can continuously use the channel and transmission occupying time used before the bus reset.

Next, the transmission occupying time will briefly be described.

In the serial bus standard, the information from the respective nodes is transmitted by an information unit which is referred to as an isochronous cycle. The isochronous cycle includes an isochronous transmission region including information to be transmitted synchronously with information included in another isochronous cycle, and an asynchronous transmission region including information to be transmitted regardless of and asynchronously with other information. Moreover, the information in the isochronous transmission region is divided for respective different channels in a time division manner, and the information which differs with each channel is transmitted.

In this case, it is standardized that in the isochronous transmission region, a length of the isochronous transmission region in one isochronous cycle (its length is standardized to be 125 $\mu$sec) is standardized to be 100 $\mu$sec at maximum. Therefore, a total of time of transmission occupied by the information allotted to each channel in one isochronous transmission region also needs to be set to 100 $\mu$sec or less. The transmission time occupied by one channel in the isochronous cycle corresponds to the aforementioned transmission occupying time. Additionally, the transmission occupying time is referred to as a serial bus use band in some case, and as a serial bus use capacity in other case. Moreover, when the length of the isochronous transmission region is less than 100 $\mu$sec (including 0) in one isochronous cycle, a region other than the isochronous transmission region in the isochronous cycle is exclusively used as an asynchronous transmission region.

Next, an actual transmission form in the serial bus standard will generally be described with reference to FIGS. 1 to 6.

Figure 3:
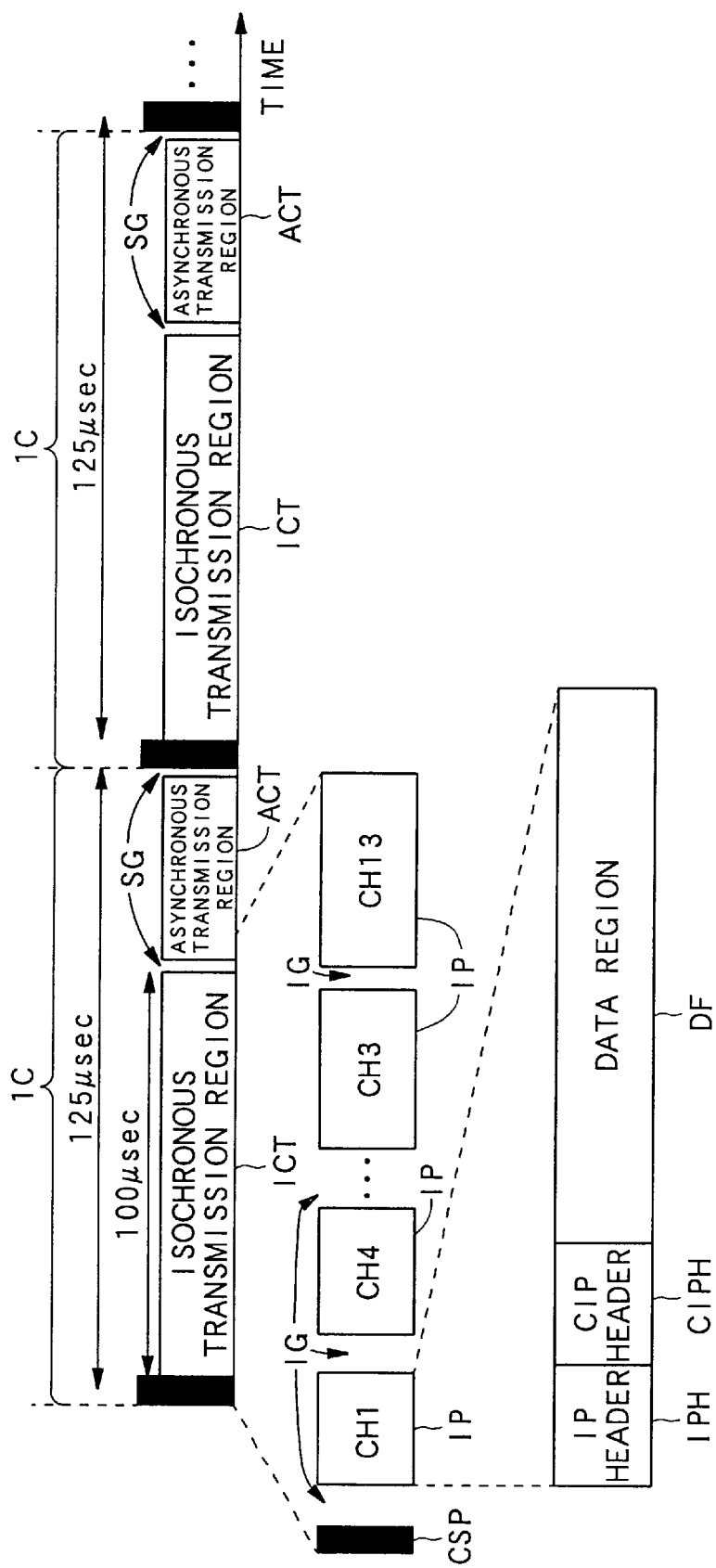
FIG. 3 is a diagram showing a constitution of an isochronous cycle.
Figure 4:
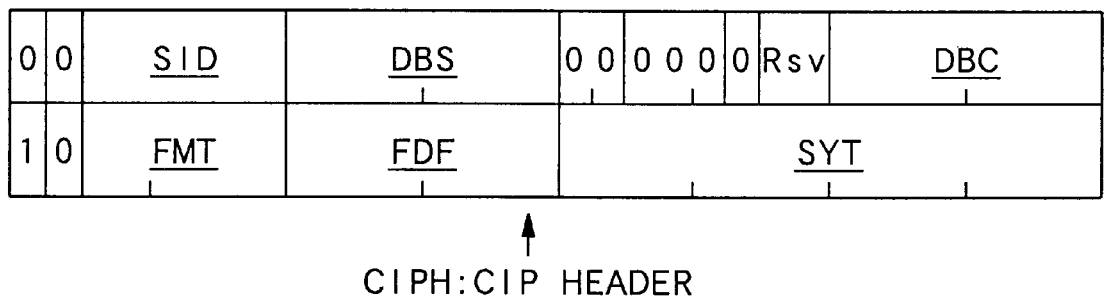
FIG. 4 is a diagram showing a constitution of a CIP header.
Figure 5:
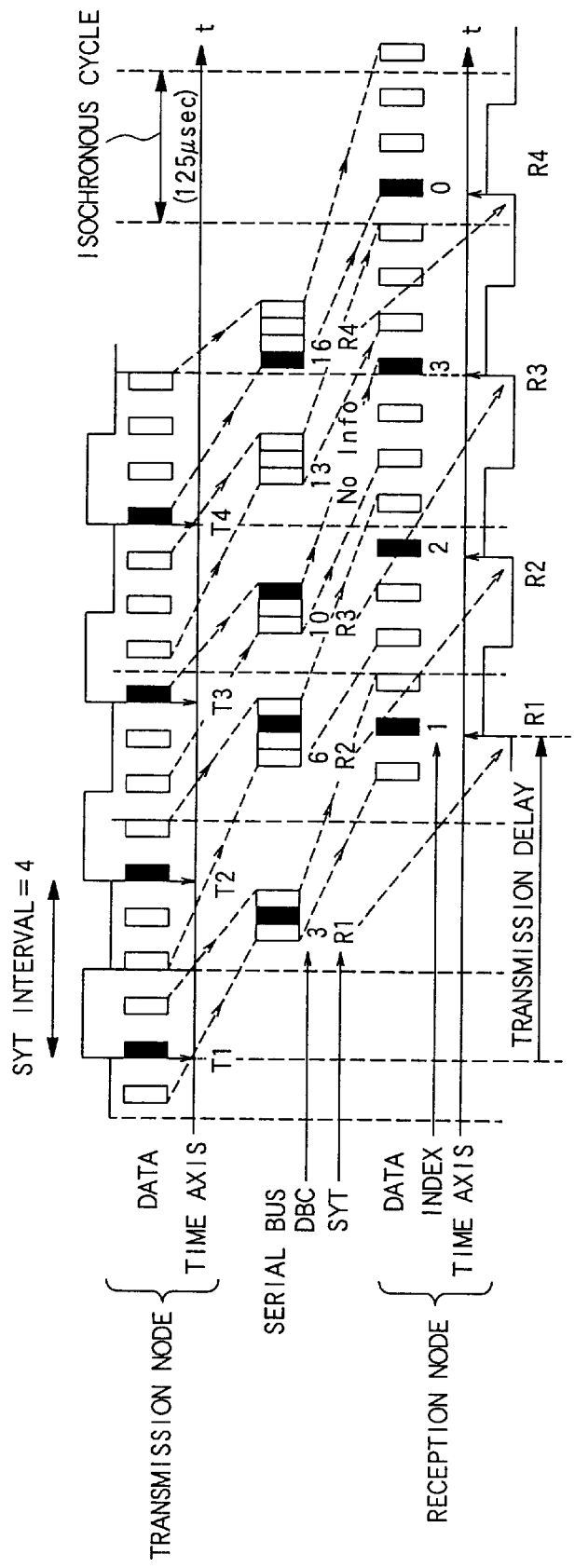
FIG. 5 is a diagram showing an actual transmission manner.
Figure 6:
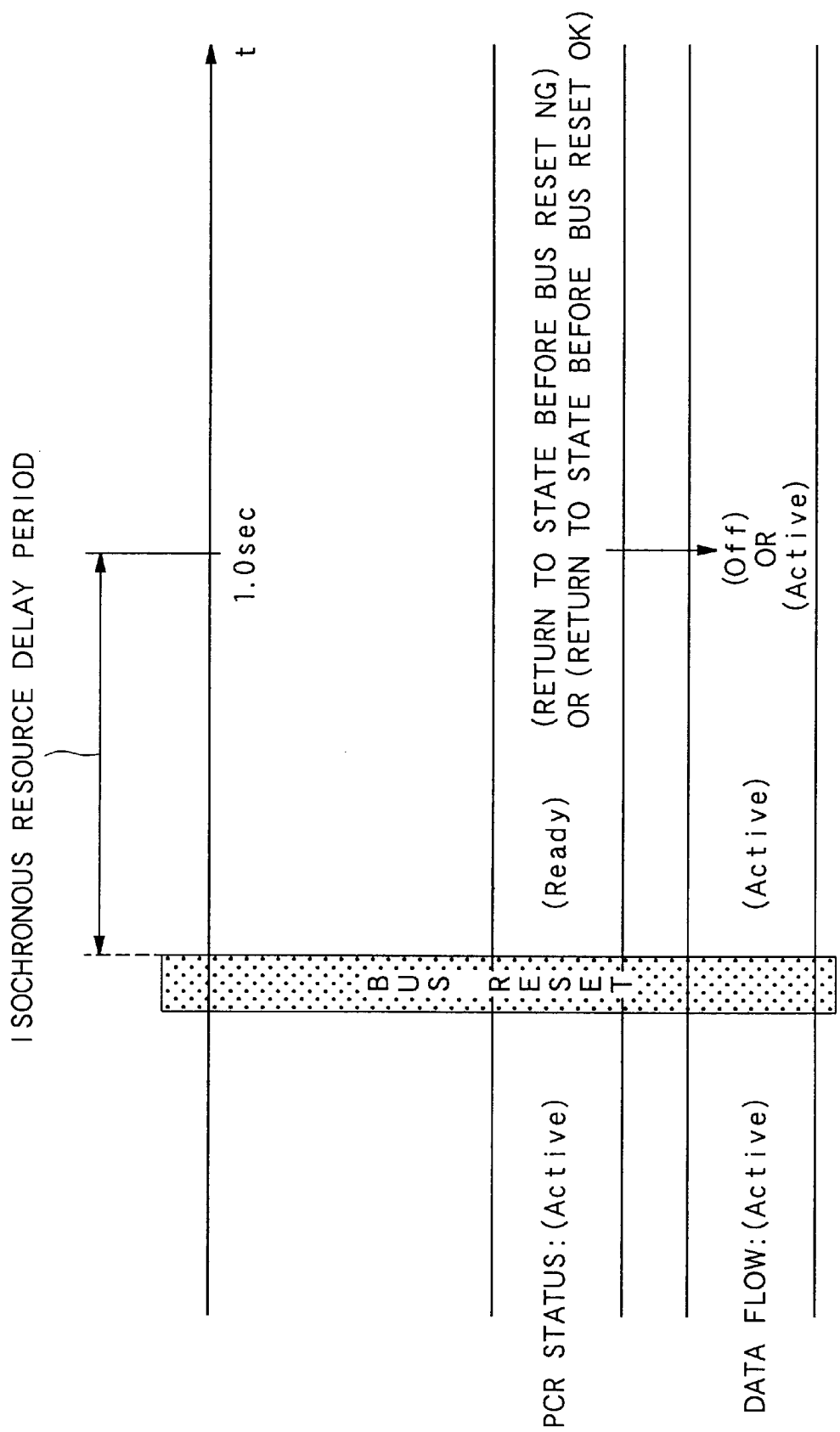
FIG. 6 is an explanatory view of information transmission before and after bus reset.

Additionally, FIG. 1 is a diagram showing one form of the topology in the serial bus standard, FIG. 2 is a diagram illustrating the transmission form on the serial bus, FIG. 3 is a diagram showing a constitution of the isochronous cycle, FIG. 4 is a diagram showing a constitution of a common isochronous packet (CIP) header, FIG. 5 is a diagram showing the actual transmission form, and FIG. 6 is an explanatory view of information transmission before and after the bus reset.

In the serial bus standard, settings are all automatically performed during connection of the respective nodes, and further a new node can be connected without cutting off power supply.

On the other hand, for the information transmission form, high speed transmission is possible in a range of 100 Mbps to 400 Mbps, and further various types of information can be transmitted by real time transmission, bi-directional transmission and multi-channel transmission.

Moreover, for each node connection form, as shown in FIG. 1A, for example, a personal computer PC is connected as a root node, which is the one on the top of a tree-like topology as described above, and various electric products such as a CD player CP, MD player MP, digital video camera DVC, printer PR, laser disc (LD) player LP, refrigerator RG, tuner T, speaker SP, amplifier AP, television set TV, video tape recorder VT, rice cooker RC, air conditioner AC and washing machine W are interconnected via serial buses B. These products can generally be controlled by the personal computer PC.

Figure 1B:
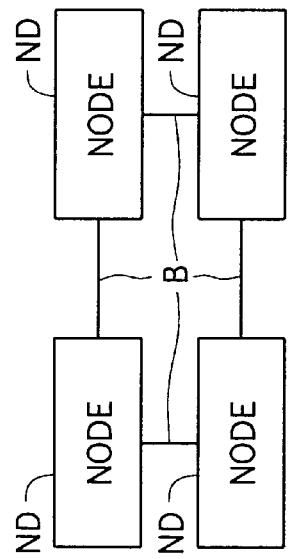
FIG. 1B is a diagram showing a loop connection of nodes according to IEEE 1394 standard.

In the serial bus standard, the number of electric products (corresponding to the nodes) which can be included in one system (connected system in a tree shape via the serial bus) is 63 at maximum, and further 16 connections at maximum between two nodes can be included in one system. Additionally, a plurality of nodes ND are prohibited from being connected in a loop shape in one system as shown in FIG. 1B by the standard.

The actual transmission form will next be described in more detail.

First, as shown in FIG. 2A, the digital video camera DVC, video tape recorder VT, personal computer PC and set top box SB for broadcasting reception are connected as the nodes to one another via the serial bus B, so that information transmission is performed. Concretely, video data from the digital video camera DVC, a predetermined control command from the video tape recorder VT, similarly a control command for controlling the other apparatuses from the personal computer PC, and image data (MPEG data compressed according to a moving picture expert group (MPEG) standard and the like) included in a received broadcasting radio wave from the set top box SB are sent onto the serial bus B, respectively.

In this case, as the transmission form of each information sent onto the serial bus B, as shown in a third stage from top of FIG. 2B, the information from each node occupies the serial bus B in a time division manner and is transmitted on the serial bus. Moreover, each information is inserted into an isochronous cycle IC as a synchronous unit having a length of 125 $\mu$sec on the serial bus B, and transmitted.

A data structure in the isochronous cycle IC will next be described with reference to FIGS. 3 and 4.

As shown in FIG. 3, the isochronous cycle IC is constituted of: a cycle start packet CSP; constantly inserted into the top of the isochronous cycle IC, for adjusting a standard time of all nodes; isochronous packets IP for a plurality of channels; an isochronous transmission region ICT constituted by including information synchronous with one another in time in the respective isochronous packets IP; and an asynchronous transmission region ACT including asynchronous information (e.g., various control information, and response information corresponding to the respective control information).

The cycle start packet CSP is usually outputted from the root node. Therefore, when any bus reset occurs as described above, and the root node is set/changed onto another node, the node for outputting the cycle start packet CSP is also changed.

Moreover, a sub action gap SG as a time gap indicating an end of one isochronous transmission region ICT or an end of one asynchronous transmission region ACT is inserted into a last part of each isochronous transmission region ICT and a last part of the asynchronous transmission region ACT. Furthermore, an isochronous gap IG as a time gap indicating an end of each packet is inserted between the isochronous packets IP and between the cycle start packet CSP and the top isochronous packet IP. In this case, a length of the sub action gap SG is set to be longer than that of the isochronous gap IG.

Moreover, one isochronous packet IP is constituted of: an isochronous packet (IP) header IPH including information indicating a data amount in each isochronous packet IP, and information indicating a channel for transmitting the information in each isochronous packet IP; a CIP header CIPH described later; and a data region DF including actual image information, or voice information. The data region DF includes a plurality of data blocks. For example, with the voice information, data for one sample is used as one data block.

On the other hand, as shown in FIG. 4, the CIP header CIPH includes at least: a node identifier (source ID) SID for identifying the node which has sent the isochronous packet IP including the CIP header CIPH; a data block number DBS indicating the number of data blocks included in the data region DF; order information (data block counter) DBC continuously applied to data in a plurality of data regions DF sent from one node in order of sending; a data identifier (format ID) FMT indicating a data type included in the data region DF; associated information (format dependent field) FDF as data associated with the data type indicated by the data identifier FMT (e.g., a sampling frequency in a case in which the data identifier FMT indicates audio data); and processing time information SYT indicating a time at which a corresponding processing is started after reception of the data included in the data region DF by the node for receiving the data.

The actual transmission form of each data will next be described with reference to FIG. 5.

Additionally, FIG. 5 shows so-called non-blocking transmission as the transmission form among the transmission forms defined in the serial bus standard.

Moreover, in FIG. 5, an SYT interval indicates an interval at which processing time information SYT is added to transmission data to be transmitted in a transmission node (transmission data to be included in the data region DF).

As shown in FIG. 5, when the transmission data to be transmitted is generated in a certain transmission node, first the processing time information SYT is applied to the transmission data for each predetermined interval (interval between time T2 and T1 in FIG. 5) among the generated transmission data.

Moreover, the generated transmission data is sent onto the serial bus B (see FIG. 2B). In this case, the order information DBC having consecutive numbers, and processing time information SYT are added to the CIP header CIPH as shown in FIG. 5.

Subsequently, when a reception node receives the isochronous cycle IC in this state, the reception node resolves the isochronous cycle IC, then extracts the transmission data, and starts the processing corresponding to each received transmission data at the time described in the processing time information SYT (denoted by "R1", "R2", . . . in FIG. 5).

In this case, a difference between time (e.g., time T1) at which the processing time information SYT is applied to the transmission data with each index added thereto in the transmission node and time (time R1 in this case) described in the corresponding processing time information SYT corresponds to a transmission delay on the serial bus B.

Next, the processing in each node with the occurrence of the bus reset will generally be described with reference to FIG. 6.

Additionally, FIG. 6 shows a node state before and after the bus reset, and transmission state of the data regarding the node. In FIG. 6, "plug control register (PCR) status" indicates a state of a register disposed for each node, and the state of the register in which information transmission state of the node (concretely, the channel and transmission occupying time being used) is described.

First, before the bus reset, the PCR status indicates the node information transmission state, and the data is normally transmitted. In FIG. 6, data flow and PCR status are both "active" before the bus reset.

Subsequently, when the bus reset occurs, and the node having detected the occurrence transmits the bus reset signal to all the other nodes, the aforementioned processes (1) to (5) are executed, and the IRM node, and the like are set.

Subsequently, for one second (referred to as an isochronous resource delay period) after the IRM node is set and each node identification number is applied, the node having transmitted the data before the bus reset uses the same channel and transmission occupying time as those before the bus reset to continuously transmit the data. In FIG. 6, the data flow is "active". In this period, the PCR status is in a standby state. In FIG. 6, the PCR status is "ready". Additionally, the transmission node inquires of the IRM node whether the channel and transmission occupying time used before the bus reset can continuously be used.

Moreover, in the inquiry of the IRM node, when the channel used before the bus reset is not used yet and the transmission occupying time can further be secured, with an elapse of one second after the bus reset, the node uses the information transmission state before the bus reset as it is to continue transmitting the data. In this case, when one second elapses after the bus reset, the data flow becomes "active" in FIG. 6.

On the other hand, when the channel used before the bus reset is being used, or when it is impossible to secure the transmission occupying time, with the elapse of one second after the bus reset, the node stops the data transmission. In this case, when one second elapses after the bus reset, the data flow becomes "off" in FIG. 6.

As described above, when one second elapses after the bus reset, and the node can secure the channel used before the bus reset and can further secure the transmission occupying time before the bus reset, this node can normally resume the information transmission.

Moreover, the other nodes temporarily stop the information transmission, inquire of the IRM node about the described in the IRM node and presently used channel and transmission occupying time each given time, and restart the information transmission when the channel desired to be used is unused and the transmission occupying time can be secured.

For the bus reset (the long bus reset) shown in FIG. 6, the time necessary for the reset is set to 167 $\mu$sec as described above.

This is standardized in the serial bus standard. The node itself for transferring the isochronous packet IP cannot detect the occurrence of the bus reset. Therefore, the time is determined to be sufficiently long such that even the node for transferring the longest isochronous packet IP can detect the bus reset.

However, since the time exceeds a time (125 $\mu$sec) corresponding to the isochronous cycle IC, smooth transfer of the isochronous packet IP is inhibited.

That is, when the long bus reset occurs during real-time reproduction, which means that the music information is reproduced and outputted while being received in the amplifier, it is determined in the amplifier that the phase locked state of the processing clock signal in the amplifier is canceled. Then, the real-time reproduction is interrupted, and so-called dropout of sound sometimes occurs in the amplifier.

To solve the problem, in a P1394a standard which has recently been established as a new serial bus standard, a new standard for executing the short bus reset (also referred to as arbitrated bus reset) is added in which the time necessary for the bus reset is as short as 1.4 $\mu$sec.

In the short bus reset, the node requesting for the bus reset performs arbitration (i.e., the node which is to be on a transmission side requests to obtain rights to use the bus). When the bus use right are acquired, the bus reset with a length of about 1.3 $\mu$sec is generated. In this case, since the other nodes are in a reception mode, all the nodes can detect the occurrence of even the short-time bus reset.

(II) Embodiment

An embodiment of the present invention executed in conformity with the aforementioned serial bus standard (concretely, the P1394a standard in which the short bus reset is standardized) will next be described with reference to FIGS. 7 to 9.

Figure 7:
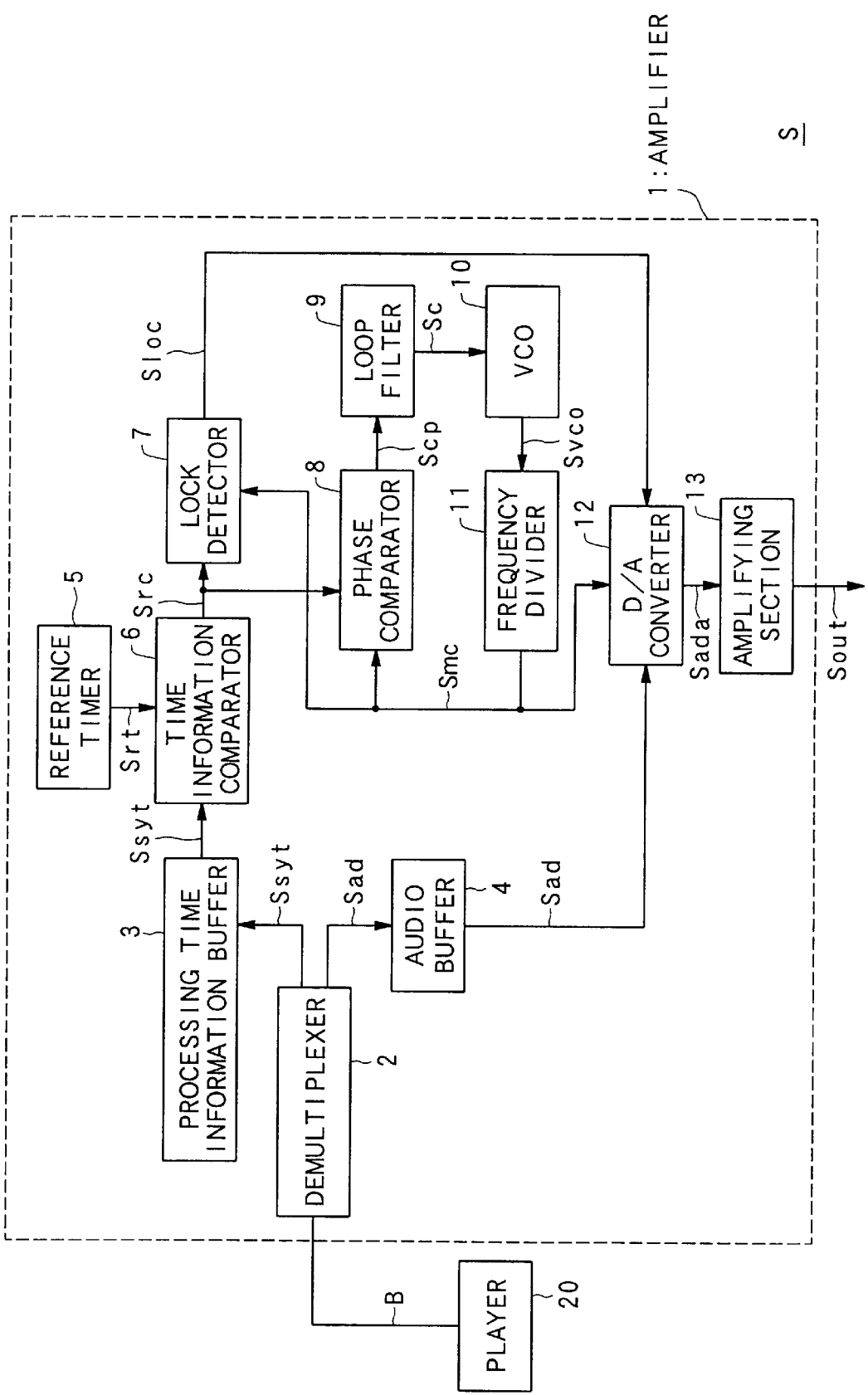
FIG. 7 is a block diagram showing an outline of a music information reproduction system according to a preferred embodiment.
Figure 8:
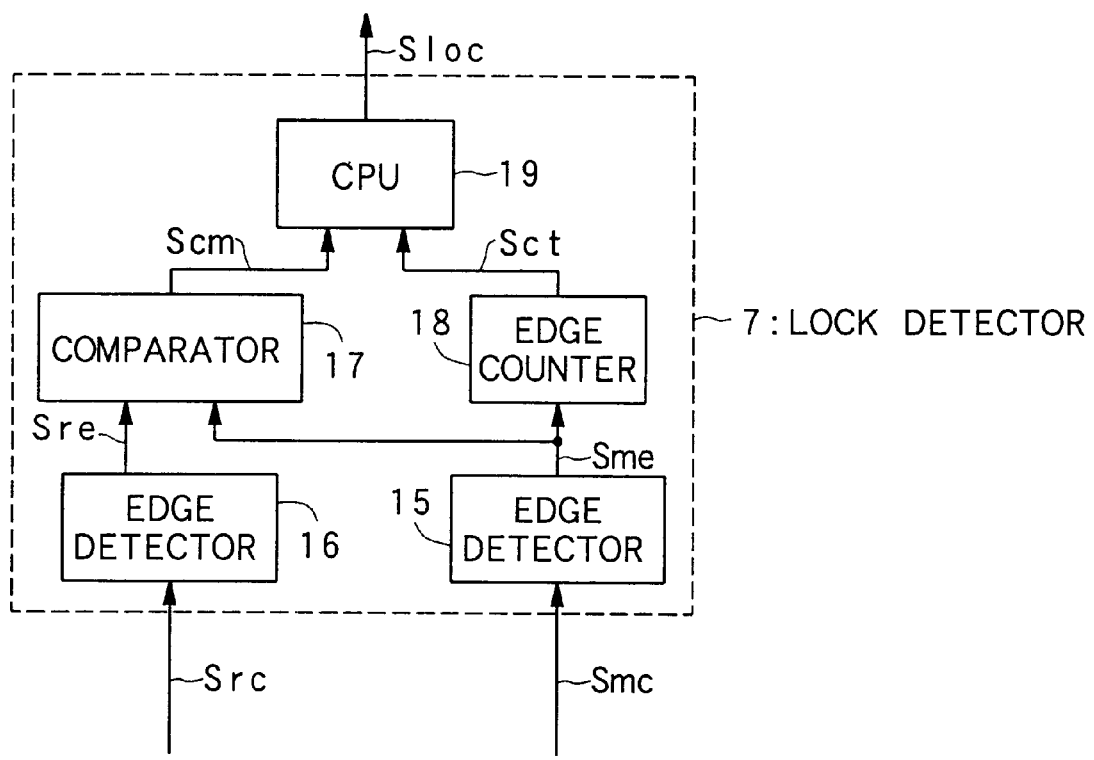
FIG. 8 is a block diagram showing a detailed constitution of a lock detector of the embodiment.
Figure 9:
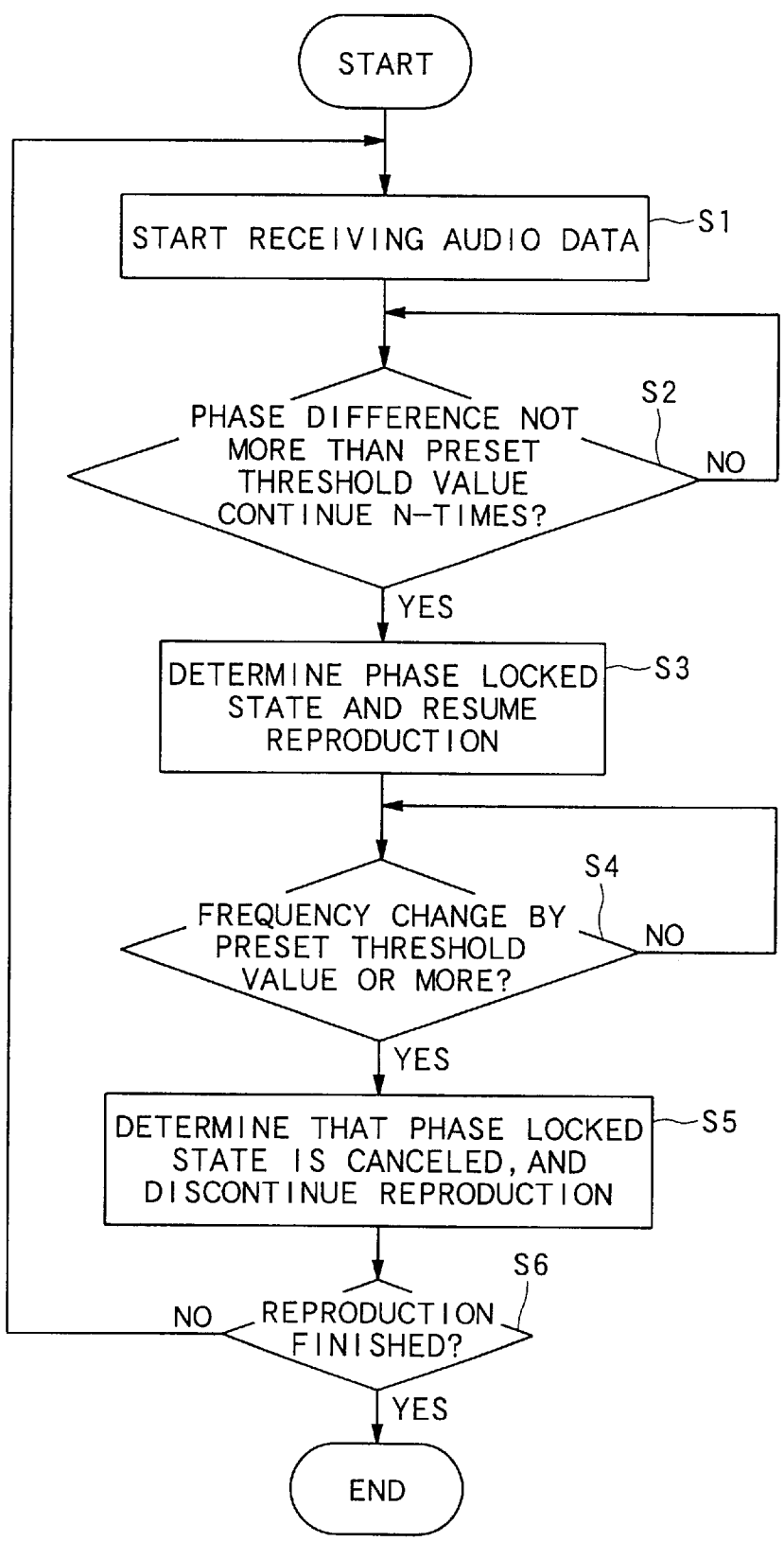
FIG. 9 is a flowchart showing a phase locked state detecting processing according to the embodiment.

Additionally, FIG. 7 is a block diagram showing an outline constitution of a music information reproduction system according to the embodiment, FIG. 8 is a block diagram showing a detailed constitution of a lock detector according to the present invention, and FIG. 9 is a flowchart showing a phase locked state detecting processing according to the present invention.

As shown in FIG. 7, a music information reproduction system S of the embodiment is provided with: a player 20 which reproduces music information recorded in information recording media such as DVD to output it to a bus B according to the serial bus standard; the bus B as the serial bus along which information transmission conforming to the serial bus standard is executed; and an amplifier 1 which provides processing such as amplification to the transmitted music information and outputs it to an external speaker (not shown) as output signal Sout.

Moreover, the amplifier 1 is constituted of a demultiplexer 2, a processing time information buffer 3, an audio buffer 4, a standard timer 5, a time information comparator 6, a lock detector 7, a phase comparator 8 as a phase comparing device, a loop filter 9 as a filter device, a VCO 10 as a generating device, a frequency divider 11 as a frequency division device, a digital/analog (D/A) converter 12 as a processing device, and an amplifying section 13 as a processing device.

The phase comparator 8, loop filter 9, VCO 10 and frequency divider 11 constitute a phase locked loop (PLL circuit).

An operation will next be described.

First, the player 20 reproduces the music information recorded in the information recording medium, forms the isochronous packet IP in which the reproduced music information is included in the data region DF, and outputs the packet to the bus B.

In this case, the processing time information SYT indicating a time at which the reproduction processing of the music information is started in the amplifier 1 is included in the CIP header CIPH in the isochronous packet IP.

Subsequently, the demultiplexer 2 having received the isochronous packet IP extracts the processing time information SYT from the isochronous packet IP, generates a time information signal Ssyt including the extracted processing time information SYT, and outputs the signal to the processing time information buffer 3.

Parallel to this operation, the demultiplexer 2 extracts the music information from the data region DF in the isochronous packet IP, generates an audio signal Sad including the extracted music information, and outputs the signal to the audio buffer 4.

Subsequently, the processing time information buffer 3 temporarily stores the time information signal Ssyt, and outputs the signal to the time information comparator 6 at a preset timing.

On the other hand, the standard timer 5 generates a standard time signal Srt including time information as a criterion for controlling the entire operation of the amplifier 1, and outputs the signal to the time information comparator 6.

Thereby, when the time indicated by the reference time signal Srt agrees with the time described as the processing time information SYT in the time information signal syt, the time information comparator 6 generates a reference clock signal Src having a preset reference frequency and outputs the signal to the lock detector 7 and phase comparator 8.

Subsequently, the phase comparator 8 compares a phase of the reference clock signal Src with a phase of a processing clock signal Smc, generates a phase difference signal Scp indicating a difference, and outputs the signal to the loop filter 9.

Moreover, the loop filter 9 passes only a low frequency component preset in the phase difference signal Scp, generates a control voltage signal Sc for voltage-controlling an oscillation frequency of the VCO 10, and outputs the signal to the VCO 10.

Thereby, the VCO 10 generates an oscillation clock signal Svco having a frequency corresponding to the voltage of the control voltage signal Sc and outputs the signal to the frequency divider 11.

Subsequently, the frequency divider 11 divides the frequency of the oscillation clock signal Svco, generates the processing clock signal Smc and outputs the signal to the phase comparator 8, lock detector 7 and D/A converter 12.

On the other hand, the lock detector 7 compares the reference clock signal Src with the processing clock signal Smc, determines whether the processing clock signal Smc is in a phase locked state with respect to the reference clock signal Src, generates a determination signal Sloc and outputs the signal to the D/A converter 12.

On the other hand, the audio buffer 4 temporarily stores an audio signal Sad, and outputs the signal to the D/A converter 12 at a preset timing.

Thereby, only when the determination signal Sloc indicates that the processing clock signal Smc is in the phase locked state with respect to the reference clock signal Src, the D/A converter 12 uses the processing clock signal Smc as the reference to convert the audio signal Sad to analog form, generates an analog audio signal Sada and outputs the signal to the amplifying section 13.

Subsequently, the amplifying section 13 amplifies the analog audio signal Sada with a preset amplification ratio, generates the output signal Sout and outputs the signal to a speaker (not shown).

Detailed constitution and operation of the lock detector 7 will next be described with reference to FIGS. 8 and 9.

As shown in FIG. 8, the lock detector 7 is constituted of edge detectors 15 and 16, a comparator 17 as a comparing device, an edge counter 18 as a detecting device, and a CPU 19 as a first and second determining device.

Outline operations of the respective constituting members will next be described.

First, the edge detector 16 detects a timing of a rising edge in the reference clock signal Src, generates an edge signal Sre and outputs the signal to the comparator 17.

Parallel to this operation, the edge detector 15 detects the rising edge timing in the processing clock signal Smc, generates an edge signal Sme and outputs the signal to the comparator 17 and edge counter 18.

Thereby, the edge counter 18 counts an interval of the rising edge timing of the processing clock signal Smc indicated by the inputted edge signal Sme, regards the interval as a value indicating the frequency in the processing clock signal Smc and outputs an interval signal Sct to the CPU 19.

On the other hand, the comparator 17 counts an interval between the rising edge timing of the processing clock signal Smc indicated by the edge signal Sme and the rising edge timing of the reference clock signal Src indicated by the edge signal Sre, regards the interval as a difference between the phase of the processing clock signal Smc and the phase of the reference clock signal Src and outputs a phase difference signal Scm to the CPU 19.

Moreover, the CPU 19 follows the following procedure to determine whether or not the processing clock signal Smc is in the phase locked state with respect to the reference clock signal Src, generates the judgment signal Sloc and outputs the signal to the D/A converter 12.

A phase locked state detecting processing executed in the CPU 19 according to the present invention will next be described with reference to FIG. 9.

In the phase locked state detecting processing, as shown in FIG. 9, first, when the amplifier 1 starts receiving music information (via the bus B) (step S1), it is determined based on the phase difference signal Scm from the comparator 17 whether or not a state in which a difference between the phase of the processing clock signal Smc and the phase of the reference clock signal Src is not more than a preset threshold value predetermined by experience continues n times in a repetition period of determination of step S2 (step S2). If the difference is not more than the preset threshold value, it can be determined that the phases are in the phase locked state Subsequently, when the state does not continue n times (step S2; NO), it is determined that the processing clock signal Smc is not in the phase locked state with respect to the reference clock signal Src at the start of a music information reproduction processing, and the processing of step S2 is performed again.

On the other hand, during repetition of the determination, the phase of the processing clock signal Smc starts to agree with the phase of the reference clock signal Src by an action of the phase locked loop. Then, the state in which the difference between the phase of the processing clock signal Smc and the phase of the reference clock signal Src is not more than the preset threshold value continues n times (step S2; YES). In this case, at the timing it is determined that the processing clock signal Smc comes into the phase locked state with respect to the reference clock signal Src and an actual reproduction processing is started (step S3).

Concretely, in the processing of the step S3, the determination signal Sloc indicating the phase locked state is outputted to the D/A converter 12, and an analog conversion processing of the audio signal Sad and amplification processing in the amplifying section 13 thereby start.

Additionally, when the processing of the step S3 is executed again after one cycle of the phase locked state detecting processing shown in FIG. 9, the reproduction processing interrupted by the last executed processing of the step S5 is resumed.

Subsequently, it is determined based on the interval signal Sct from the edge counter 18 whether or not the change of the frequency of the processing clock signal Smc is not less than the preset threshold value (step S4). The preset threshold value is a change threshold value by which it can be determined that the phase locked state preset by experience has been canceled.

Moreover, when the change of the frequency is less than the preset threshold value (step S4; NO), an operation of continuously outputting the determination signal Sloc indicating the phase locked state and performing the determination of the step S4 again is repeated in the preset period.

In this case, when the short bus reset occurs during execution of the reproduction processing using the processing clock signal Smc in the phase locked state, the node for transmitting the cycle start packet CSP before and after the short bus reset is changed to another node. Concretely, for example, the root node is changed to the amplifier 1 from the player 20 because of the short bus reset generated from a state change of the player 20. Then, the operation of the reference timer 5 fluctuates only for a remarkably short time (1.4 μsec). Therefore, even when the reference clock signal Src fluctuates for the remarkably short time, the frequency of the processing clock signal Src as the output of the phase locked loop does not rapidly change. As a result, even when the short bus reset occurs, "NO" state of the determination of the step S4 continues (i.e., the reproduction processing continues).

On the other hand, when it is determined in step S4 that the frequency change is not less than the preset threshold value (step S4: YES), the transmission of the processing time information SYT is interrupted by the occurrence of the long bus reset. Thereby, it is determined that the generation of the standard clock signal Src from the time information comparator 6 is temporarily discontinued and the phase locked state is canceled. Then, the determination signal Sloc for temporarily interrupting the reproduction processing is generated and outputted to the D/A converter 12 (step S5).

Subsequently, it is determined whether or not the reproduction processing of the music information in the amplifier 1 is all finished (step S6). When the processing is finished, the phase locked state detecting processing is finished as it is. When the reproduction processing is not all finished (step S6), the flow returns to the step S1 in order to perform the aforementioned processing with respect to the music information transmitted via the bus B.

As described above, according to the phase locked state detecting processing of the present embodiment, a result of comparison of the phase of the processing clock signal Smc with the phase of the reference clock signal Src is used to determine whether or not the processing clock signal Smc is in the phase locked state. Subsequently, based on the change of the frequency (i.e., the frequency which does not follow the change of the reference clock signal Src or does not quickly fluctuate even if the signal changes only for the remarkably short time by the generation of the short bus reset) of the processing clock signal Smc itself, it is determined whether or not the phase locked state is canceled. Therefore, it is not determined by the change of the reference clock signal Src for the remarkably short time that the phase locked state is canceled. The reproduction processing using the processing clock signal Smc in the phase locked state can be continued. Additionally, it can be detected more accurately whether or not the processing clock signal Smc is in the phase locked state.

Moreover, when the state in which the difference between the phase of the reference clock signal Src and the phase of the processing clock signal Smc is not more than the preset threshold value is continued n times, it is determined that the processing clock signal Smc is in the phase locked state. Additionally, when a state in which the difference is not more than the preset threshold value continues n times, the processing clock signal Smc is determined not to be in the phase locked state. Therefore, it can be determined more securely whether or not the processing clock signal Smc is in the phase locked state.

Furthermore, when the change of the frequency of the processing clock signal Smc is less than the preset threshold value, it is determined that the signal is in the phase locked state. Additionally, when the change is not less than the preset threshold value, it is determined that the phase locked state is canceled. Therefore, only the processing clock signal Smc can be used to securely determine whether or not the signal is in the phase locked state.

(III) Modification

A modification of the present invention will next be described with reference to FIG. 10.

Figure 10:
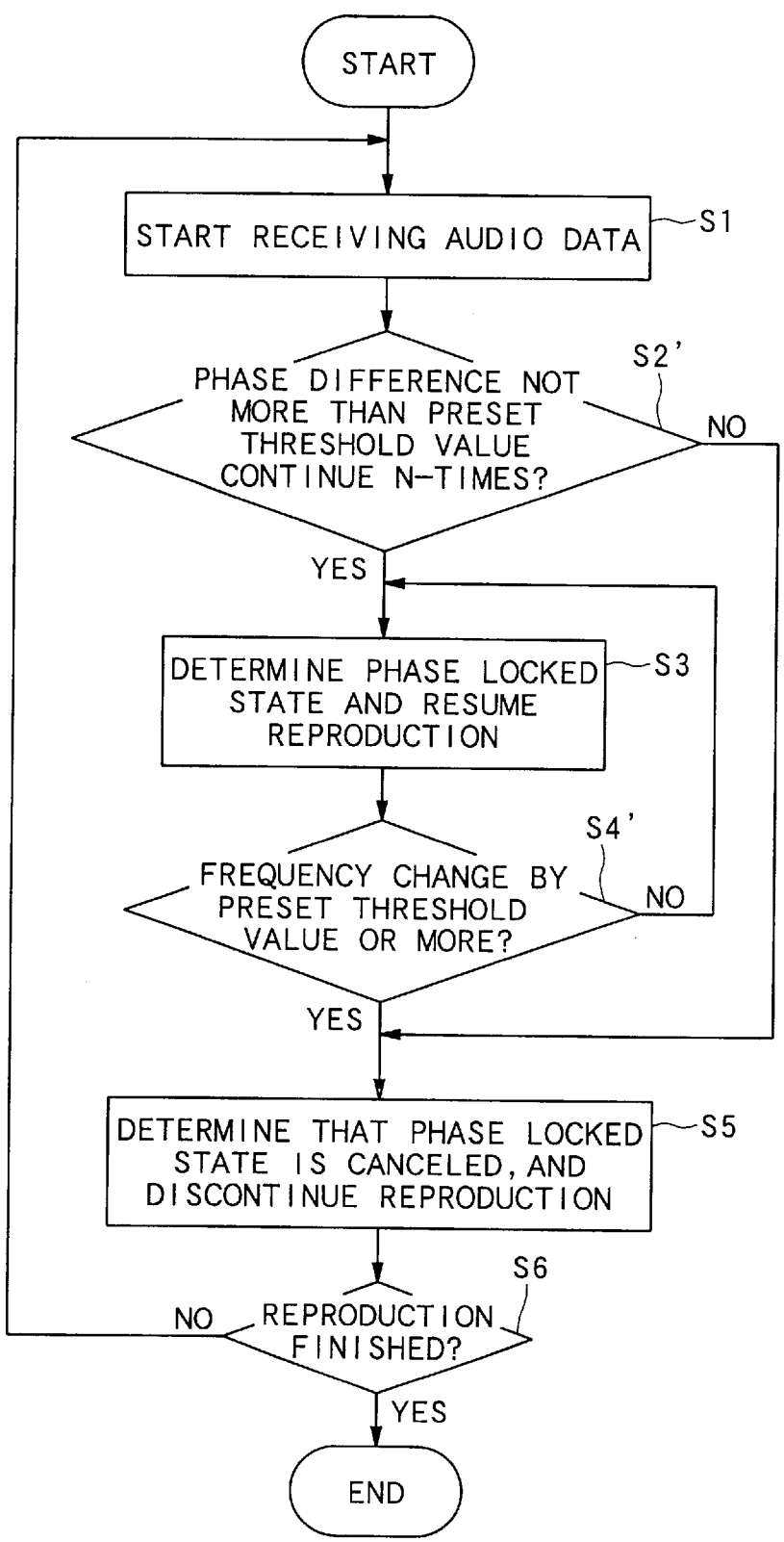
FIG. 10 is a flowchart showing the phase locked state detecting processing according to a modification.

Additionally, in a flowchart of the phase locked state detecting processing according to the modification shown in FIG. 10, the processing similar to the processing shown in the flowchart of FIG. 9 is denoted with the same step numbers, and detailed description thereof is omitted.

In the aforementioned modification, in the determination of the step S2 shown in FIG. 9, when the state in which the difference between the phase of the processing clock signal Smc and the phase of the reference clock signal Src is not more than the preset threshold value does not continue n times (step S2; NO), moreover, in the determination of the step S4, when the change of the frequency of the processing clock signal Smc is not more than the preset threshold value (step S4; NO), the processing of the step S2 or S4 is repeated as it is.

Additionally, as in step S2' or S4' in FIG. 10, when the state in which the difference between the phase of the processing clock signal Smc and the phase of the reference clock signal Src is not more than the preset threshold value does not continue n times (step S2'; NO), it is determined that the phase locked state is canceled, and the reproduction processing is interrupted (step S5). Furthermore, when the change of the frequency of the processing clock signal Smc is not more than the preset threshold value (step S4; NO), it is determined that the phase locked state is returned, and the reproduction processing can be resumed (step S3).

In this constitution, it can securely be detected that the phase locked state of the processing clock signal Smc is canceled and that the phase locked state is returned.

In the aforementioned embodiment and modification, the case in which the music information transmitted from the player 20 is reproduced/processed in the amplifier 1 has been described. Additionally, the present invention can also be applied to the detection of the phase locked state in the reproduction apparatus when image information other than the music information is transmitted, reproduced and processed.

Moreover, in addition to the reproduction processing of the transmitted information, the present invention can be applied to the detection of the phase locked state in the recording apparatus when the information can be recorded in the information recording medium.

The invention may be embodied in other specific forms without departing from the spirit or essential characteristics thereof. The present embodiments are therefore to be considered in all respects as illustrative and not restrictive, the scope of the invention being indicated by the appended claims rather than by the forgoing description and all changes which come within the meaning and range of equivalency of the claims are therefore intended to be embraces therein.

The entire disclosure of Japanese Patent Application No. 2000-113932 filed on Apr. 14, 2000 including the specification, claims, drawings and summary is incorporated herein by reference in its entirety.

What is claimed is:

1. A phase locked state detecting apparatus for detecting a phase locked state of a processing clock signal generated by a phase locked loop and used in an information processing, the phase locked state detecting apparatus comprising:

a comparing device which compares a phase of a reference clock signal as the reference for controlling a phase of the processing clock signal by the phase locked loop with a phase of the processing clock signal and generates a comparison signal;

a detecting device which detects a frequency of the processing clock signal and generates a detecting signal;

a first determining device which determines on the basis of the comparison signal whether or not the processing clock signal is in the phase locked state with respect to the reference clock signal; and a second determining device which determines on the basis of the detecting signal whether or not the phase locked state is canceled after the first determining device determines that the processing clock signal is in the phase locked state.

2. The phase locked state detecting apparatus according to claim 1, wherein the first determining device determines on the basis of the comparison signal that the processing clock signal is in the phase locked state with respect to the reference clock signal when a difference between the phase of the reference clock signal and the phase of the processing clock signal continues to be not more than a preset value for a preset period, and determines that the processing clock signal is not in the phase locked state with respect to the reference clock signal when a state of the difference being not more than the value does not continue for the period.

3. The phase locked state detecting apparatus according to claim 1, wherein the second determining device determines on the basis of the detecting signal that the processing clock signal is in the phase locked state with respect to the reference clock signal when a change of the frequency of the processing clock signal is less than a preset threshold value, and determines that the processing clock signal is not in the phase locked state with respect to the reference clock signal when the change is not less than the threshold value.

4. The phase locked state detecting apparatus according to claim 2, wherein the second determining device determines on the basis of the detecting signal that the processing clock signal is in the phase locked state with respect to the reference clock signal when a change of the frequency of the processing clock signal is less than a preset threshold value, and determines that the processing clock signal is not in the phase locked state with respect to the reference clock signal when the change is not less than the threshold value.

5. An information processing apparatus including a phase locked state detecting apparatus for detecting a phase locked state of a processing clock signal generated by a phase locked loop and used in an information processing, the phase locked state detecting apparatus comprising: a comparing device which compares a phase of a reference clock signal as the reference for controlling a phase of the processing clock signal by the phase locked loop with a phase of the processing clock signal and generates a comparison signal; a detecting device which detects a frequency of the processing clock signal and generates a detecting signal; a first determining device which determines on the basis of the comparison signal whether or not the processing clock signal is in the phase locked state with respect to the reference clock signal; and a second determining device which determines on the basis of the detecting signal whether or not the phase locked state is canceled after the first determining device determines that the processing clock signal is in the phase locked state, the information processing apparatus comprising:

a phase comparing device which detects a phase difference between the reference clock signal and the processing clock signal and outputs a phase difference signal in the phase locked loop;

a filter device which subjects the outputted phase difference signal to a predetermined filter processing and outputs a filter signal in the phase locked loop;

a generating device which generates an oscillation clock signal based on the outputted filter signal in the phase locked loop;

a frequency division device which divides a frequency of the generated oscillation clock signal, generates the processing clock signal and outputs the processing clock signal to the phase locked state detecting apparatus and the phase comparing device in the phase locked loop; and a processing device using the processing clock signal in the phase locked state with respect to the reference clock signal to perform an information processing based on a result of the determination in the phase locked state detecting apparatus.

6. The information processing apparatus according to claim 5, wherein the information processing is a reproduction processing of audio information inputted from the outside.

7. The information processing apparatus according to claim 5, wherein the first determining device determines on the basis of the comparison signal that the processing clock signal is in the phase locked state with respect to the reference clock signal when a difference between the phase of the reference clock signal and the phase of the processing clock signal continues to be not more than a preset value for a preset period, and determines that the processing clock signal is not in the phase locked state with respect to the reference clock signal when a state of the difference being not more than the value does not continue for the period.

8. The information processing apparatus according to claim 5, wherein the second determining device determines on the basis of the detecting signal that the processing clock signal is in the phase locked state with respect to the reference clock signal when a change of the frequency of the processing clock signal is less than a preset threshold value, and determines that the processing clock signal is not in the phase locked state with respect to the reference clock signal when the change is not less than the threshold value.

9. The information processing apparatus according to claim 7, wherein the second determining device determines on the basis of the detecting signal that the processing clock signal is in the phase locked state with respect to the reference clock signal when a change of the frequency of the processing clock signal is less than a preset threshold value, and determines that the processing clock signal is not in the phase locked state with respect to the reference clock signal when the change is not less than the threshold value.

10. A phase locked state detecting method for detecting a phase locked state of a processing clock signal generated by a phase locked loop and used in an information processing, the phase locked state detecting method comprising:

a comparing process which compares a phase of a reference clock signal as the reference for controlling a phase of the processing clock signal by the phase locked loop with a phase of the processing clock signal and generates a comparison signal;

a detecting process which detects a frequency of the processing clock signal and generates a detecting signal;

a first determining process which determines on the basis of the comparison signal whether or not the processing clock signal is in the phase locked state with respect to the reference clock signal; and a second determining process which determines on the basis of the detecting signal whether or not the phase locked state is canceled after the first determining device determines that the processing clock signal is in the phase locked state.

11. The phase locked state detecting method according to claim 10, wherein the first determining process determines on the basis of the comparison signal that the processing clock signal is in the phase locked state with respect to the reference clock signal when a difference between the phase of the reference clock signal and the phase of the processing clock signal continues to be not more than a preset value for a preset period, and determines that the processing clock signal is not in the phase locked state with respect to the reference clock signal when a state of the difference being not more than the value does not continue for the period.

12. The phase locked state detecting method according to claim 10, wherein the second determining process determines on the basis of the detecting signal that the processing clock signal is in the phase locked state with respect to the reference clock signal when a change of the frequency of the processing clock signal is less than a preset threshold value, and determines that the processing clock signal is not in the phase locked state with respect to the reference clock signal when the change is not less than the threshold value.

13. The phase locked state detecting method according to claim 11, wherein the second determining process determines on the basis of the detecting signal that the processing clock signal is in the phase locked state with respect to the reference clock signal when a change of the frequency of the processing clock signal is less than a preset threshold value, and determines that the processing clock signal is not in the phase locked state with respect to the reference clock signal when the change is not less than the threshold value.

14. An information processing method including a phase locked state detecting method for detecting a phase locked state of a processing clock signal generated by a phase locked loop and used in an information processing, the phase locked state detecting method comprising: a comparing process which compares a phase of a reference clock signal as the reference for controlling a phase of the processing clock signal by the phase locked loop with a phase of the processing clock signal and generates a comparison signal; a detecting process which detects a frequency of the processing clock signal and generates a detecting signal; a first determining process which determines on the basis of the comparison signal whether or not the processing clock signal is in the phase locked state with respect to the reference clock signal; and a second determining process which determines on the basis of the detecting signal whether or not the phase locked state is canceled after the first determining process determines that the processing clock signal is in the phase locked state, the information processing method comprising:

a phase comparing process which detects a phase difference between the reference clock signal and the processing clock signal and outputs a phase difference signal in the phase locked loop;

a filter process which subjects the outputted phase difference signal to a predetermined filter processing and outputs a filter signal in the phase locked loop;

a generating process which generates an oscillation clock signal based on the outputted filter signal in the phase locked loop;

a frequency division process which divides a frequency of the generated oscillation clock signal, generates the processing clock signal and outputs the processing clock signal so as to be used for the phase locked state detecting process and the phase comparing process in the phase locked loop; and a processing process using the processing clock signal in the phase locked state with respect to the reference clock signal to perform an information processing based on a result of the determination of the first determining process or the second determining process.

15. The information processing method according to claim 14, wherein the information processing is a reproduction processing of audio information inputted from the outside.

16. The information processing method according to claim 14, wherein the first determining process determines on the basis of the comparison signal that the processing clock signal is in the phase locked state with respect to the reference clock signal when a difference between the phase of the reference clock signal and the phase of the processing clock signal continues to be not more than a preset value for a preset period, and determines that the processing clock signal is not in the phase locked state with respect to the reference clock signal when a state of the difference being not more than the value does not continue for the period.

17. The information processing method according to claim 14, wherein the second determining process determines on the basis of the detecting signal that the processing clock signal is in the phase locked state with respect to the reference clock signal when a change of the frequency of the processing clock signal is less than a preset threshold value, and determines that the processing clock signal is not in the phase locked state with respect to the reference clock signal when the change is not less than the threshold value.

18. The information processing method according to claim 16, wherein the second determining process determines on the basis of the detecting signal that the processing clock signal is in the phase locked state with respect to the reference clock signal when a change of the frequency of the processing clock signal is less than a preset threshold value, and determines that the processing clock signal is not in the phase locked state with respect to the reference clock signal when the change is not less than the threshold value.

19. A phase locked state detecting apparatus comprising:

a comparator circuit which compares a phase of a reference clock signal with a phase of processing clock signal and generates a comparison signal; and a control circuit which detects a frequency of the processing clock signal and generates a detecting signal, determines on the basis of the comparison signal whether or not the processing clock signal is in the phase locked state with respect to the reference clock signal, and determines on the basis of the detecting signal whether or not the phase locked state is canceled.

20. The phase locked state detecting apparatus according to claim 19, wherein the control circuit is further operable to determine on the basis of the detecting signal a change of frequency of the processing clock signal.

21. The phase locked state detecting apparatus according to claim 20, wherein the control circuit is further operable to determine on the basis of the detecting signal that the processing clock signal is in the phase locked state with respect to the reference clock signal when the change of the frequency of the processing clock signal is less than a preset threshold value, and determine that the processing clock signal is not in the phase locked state with respect to the reference clock signal when the change is not less than the threshold value.

22. The phase locked state detecting apparatus according to claim 19, wherein the control circuit is further operable to determine on the basis of the comparison signal that the processing clock signal is in the phase locked state with respect to the reference clock signal when a difference between the phase of the reference clock signal and the phase of the processing clock signal continues to be not more than a preset value for a preset period, and determine that the processing clock signal is not in the phase locked state with respect to the reference clock signal when a state of the difference being not more than the value does not continue for the period.

23. The phase locked state detecting apparatus according to claim 22, wherein the control circuit is further operable to determine on the basis of the detecting signal a change of frequency of the processing clock signal, determine on the basis of the detecting signal that the processing clock signal is in the phase locked state with respect to the reference clock signal when the change of the frequency of the processing clock signal is less than a preset threshold value, and determine that the processing clock signal is not in the phase locked state with respect to the reference clock signal when the change is not less than the threshold value.

* * * * *